United States Patent [19]

Boenning et al.

[11] Patent Number: 4,988,949
[45] Date of Patent: Jan. 29, 1991

[54] APPARATUS FOR DETECTING EXCESSIVE CHAFING OF A CABLE ARRANGEMENT AGAINST AN ELECTRICALLY GROUNDED STRUCTURE

[75] Inventors: Robert A. Boenning, Timonium; Harvey H. White, Jr., Hampstead, both of Md.

[73] Assignee: Westinghouse Electric Corp., Pittsburgh, Pa.

[21] Appl. No.: 351,498

[22] Filed: May 15, 1989

[51] Int. Cl.$^5$ ............................................. G01R 31/02
[52] U.S. Cl. .................................... 324/541; 174/115; 174/120 SC; 324/509; 324/522
[58] Field of Search ............... 324/509, 510, 544, 541, 324/551, 557, 525, 522, 523, 527; 340/647, 649, 650, 651; 174/120 SC, 115; 379/26

[56] References Cited

U.S. PATENT DOCUMENTS

| | | | |
|---|---|---|---|
| 2,691,698 | 10/1954 | Schmidt | 340/647 X |
| 2,752,590 | 6/1956 | Towle . | |
| 3,648,282 | 3/1972 | Kelly . | |
| 3,727,128 | 4/1973 | McFerrin | 324/533 |
| 4,110,739 | 8/1978 | Kidd | 174/120 SC X |
| 4,165,482 | 8/1979 | Gale | 324/523 |
| 4,301,399 | 11/1981 | Miller et al. . | |
| 4,859,989 | 8/1989 | McPherson | 340/647 X |

FOREIGN PATENT DOCUMENTS

| | | | |
|---|---|---|---|
| 0001413 | 1/1981 | Japan | 174/120 SC |
| 1330924 | 9/1973 | United Kingdom | 174/115 |

*Primary Examiner*—Reinhard J. Eisenzopf
*Assistant Examiner*—Robert Mueller
*Attorney, Agent, or Firm*—John K. Williamson; Joseph C. Spadacene

[57] ABSTRACT

An apparatus for detecting excessive chafing of a cable arrangement against an electrically grounded structure includes a layer of semiconductive material positioned in surrounding relation with an elongated member such as an electrical cable, tube or hose. A layer of electrically insulating material surrounds the layer of semiconductive material. A detector circuit is electrically connected with a reference end portion of the semiconductive layer. The detector circuit is operable to detect at least momentary contact between the layer of semiconductive material and an electrically grounded structure due to erosion of the layer of electrically insulating material surrounding the semiconductive layer caused by excessive chafing of the layer of electrically insulating material against the ground structure. The detector circuit is further operable to provide an indication of the distance measured along the layer of semiconductive material between the reference end portion of the semiconductive layer and the location at which the layer of semiconductive material has at least momentarily contacted the electrically grounded structure.

21 Claims, 8 Drawing Sheets

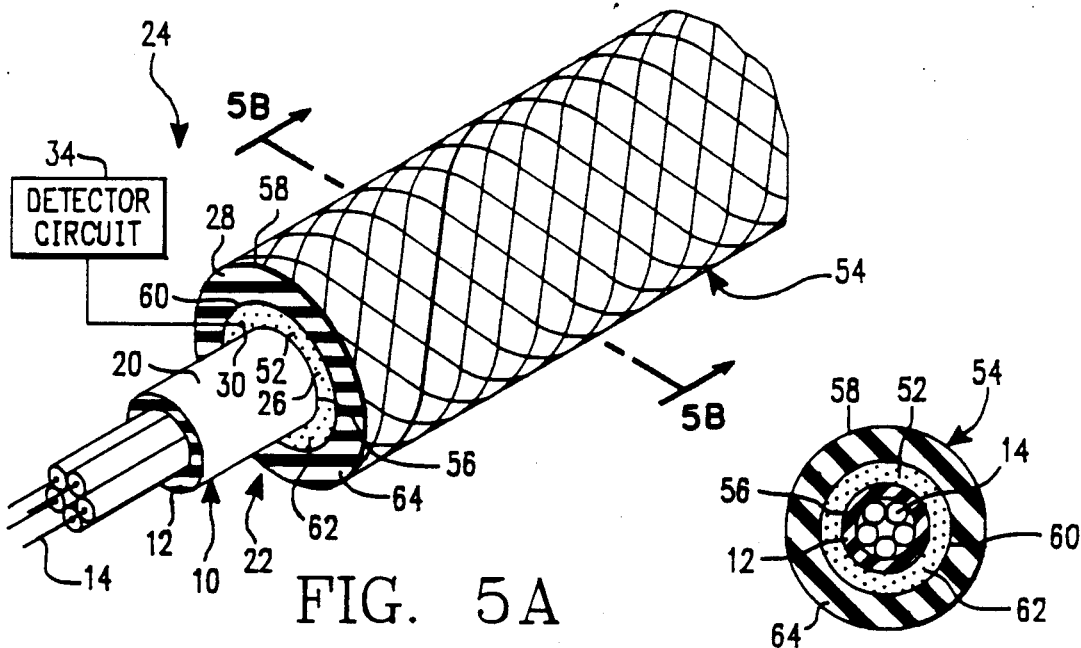
FIG. 5A
FIG. 5B
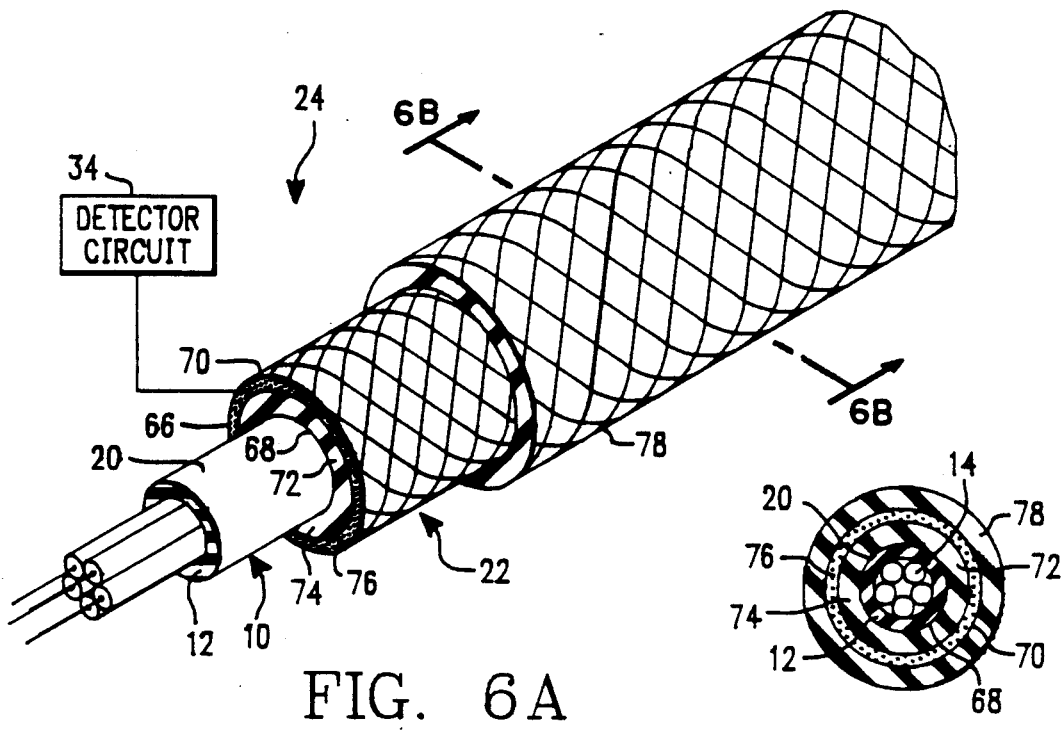
FIG. 6A
FIG. 6B

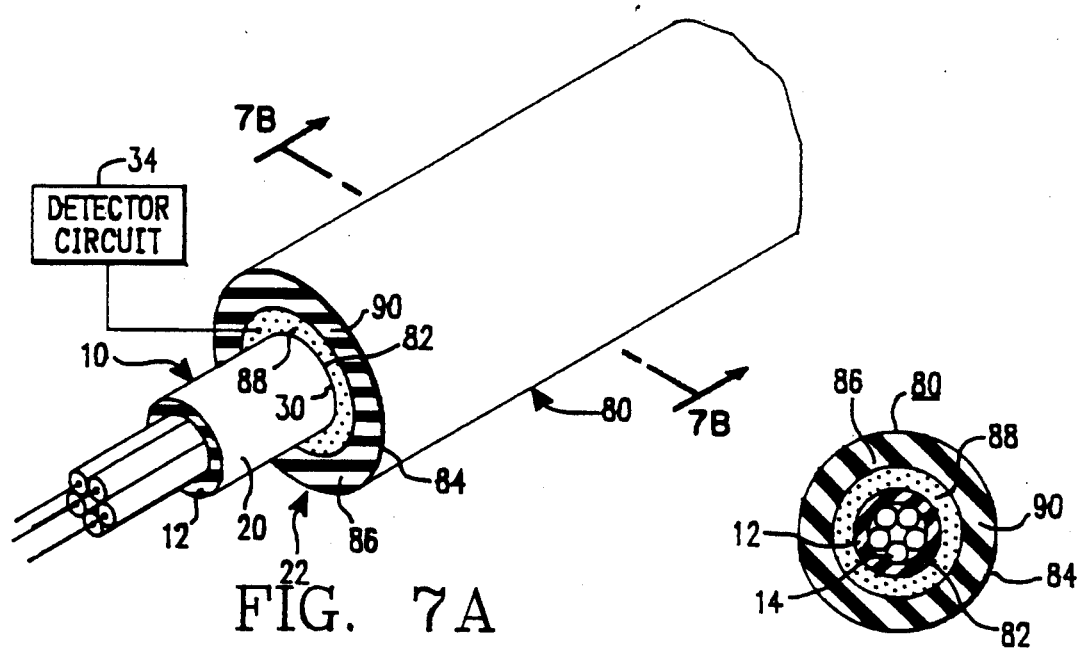
FIG. 7A
FIG. 7B
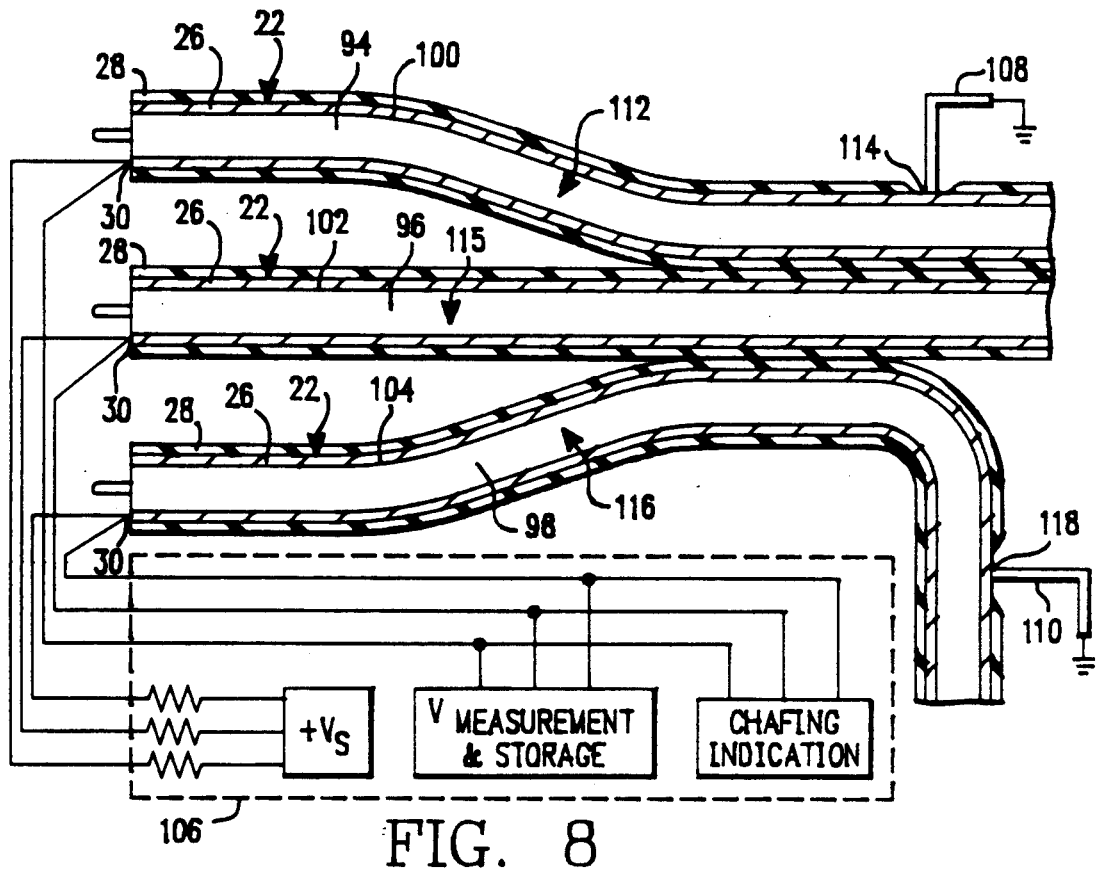
FIG. 8

APPARATUS FOR DETECTING EXCESSIVE CHAFING OF A CABLE ARRANGEMENT AGAINST AN ELECTRICALLY GROUNDED STRUCTURE

BACKGROUND OF THE INVENTION

1. Field of the Invention

This invention relates generally to the field of cable failure detection, and more particularly, to an apparatus for detecting excessive chafing of a cable arrangement against an electrically grounded structure prior to actual cable failure.

2. Background Information

It is well known that chafing between a pair of objects occurs when the pair of objects are brought into contact with each other and relative motion between the objects takes place. It is further well recognized that continued chafing between the pair of objects will, over time, result in erosion-induced damage to one or both of the objects. Consider, for example, the chafing which occurs when an electrical cable which forms a portion of an electrical system contacts the system hardware or support structure at some point along the cable's length and relative motion, i.e., chafing, between the cable and structure occurs. This relative motion can result from vibration of or within the electrical system, or from the frequent removal and installation of a replaceable unit to which the cable is attached. Since the electrical cable which is experiencing chafing is normally embedded in the electrical system and thus hidden from view, chafing goes largely undetected. If the structural member against which the electrical cable is chafing is electrically grounded, the cable itself will fail when the protective insulation surrounding the cable's current-carrying conductor erodes sufficiently as a result of chafing to allow the conductor to contact the grounded structural member. Grounding the current-carrying conductor not only results in an interruption of current flow to the load device connected with the cable, but may also result in damage to the source which supplies power to the load device via the electrical cable.

As an example of the serious problems which may arise as a result of undetected cable chafing, consider the electrical systems of present day aircraft. These electrical systems predominantly utilize unarmored cables in order to reduce the aircraft's overall weight. It is readily apparent that the failure of an aircraft electrical cable during flight as a result of chafing between the electrical cable and the grounded air frame can cause engine failure or the loss of navigational instrumentation. Obviously, these situations would greatly endanger the safety of all on-board personnel.

Many of the complex equipment systems presently utilized in industries related to transportation and manufacturing include electrical and hydraulic/pneumatic subsystems; and it is apparent that portions of the electrical cabling and hydraulic and pneumatic tubing utilized in these subsystems will invariably be subjected to chafing during their operating life. Chafing-induced cable or tubing failures that result in shutdown of the equipment system will require valuable time to determine the cause of the shutdown, locate the failure and effect a repair. This situation is complicated by the fact that, at present, there is no easy way to determine the exact location of a chafing-induced failure even after it is determined that the system shutdown actually resulted from cable or tubing chafing. In addition, in the case of chafing-induced electrical cable failures, the exact location of the failure may be detected utilizing presently available test or detection equipment only if contact is maintained between the current-carrying conductor of the chafed cable and the grounded structural member or equipment support hardware. If the current-carrying conductor of the chafed cable is only momentarily brought into contact with the grounded structural member or system support hardware (as in the case of transient chafing due to vibration), conventional failure detection equipment is incapable of determining the exact location of the cable failure.

Therefore, there is a need for an apparatus which includes a sacrificial covering positioned in surrounding relation with an electrical cable or other tubing which is operable in conjunction with a detector circuit connected therewith to detect chafing of the sacrificial covering against an electrically grounded structural member. Since the sacrificial covering surrounds the cable or other tubing, any chafing-induced erosion experienced by the cable/sacrificial covering arrangement will take place in the covering rather than in the cable. The detector circuit should be operable to provide an indication of chafing-induced erosion of the sacrificial covering well before the cable itself experiences actual chafing against the grounded structural member. This timely indication will allow the chafing condition to be corrected prior to chafing-induced failure of the cable or tubing itself. In addition to providing an indication of chafing-induced erosion of the sacrificial covering, the detector circuit should be capable of providing an indication of the distance to the chafing location measured from a reference end of the sacrificial covering in order to avoid the need for a visual inspection of the entire covering to locate the chafe. Finally, the detector circuit should be capable of providing an indication of chafing-induced erosion of the sacrificial covering in the event that the chafing is transient or intermittent.

SUMMARY OF THE INVENTION

In accordance with the present invention, there is provided apparatus for detecting excessive chafing between a cable arrangement and an electrically grounded structure which includes an elongated member of preselected length having a pair of opposing end portions and an outer surface extending therebetween. A layer of semiconductive material is positioned in surrounding relation with the outer surface of the elongated member and extends over a predetermined length thereof. A layer of electrically insulating material surrounds the layer of semiconductive material. The elongated member, layer of semiconductive material and layer of electrically insulating material form the cable arrangement. A detector circuit is electrically connected with the layer of semiconductive material, and includes means for detecting at least momentary contact between the layer of semiconductive material and an electrically grounded structure due to erosion of the layer of electrically insulating material caused by excessive chafing of the layer of electrically insulating material against the grounded structure. The detector circuit is operable to detect the contact of the layer of semiconductive material forming a portion of the cable arrangement with the electrically grounded structure prior to actual chafing of the elongated member against the electrically grounded structure.

Further in accordance with the present invention, there is provided apparatus for detecting excessive chafing between a cable arrangement and an electrically grounded structure which includes an elongated member of preselected length having a pair of opposing end portions and an outer surface extending therebetween. A layer of semiconductive material is positioned in surrounding relation with the outer surface of the elongated member and extends over a predetermined length thereof. The layer of semiconductive material includes a first reference end portion and an opposite second end portion. A layer of electrically insulating material surrounds the layer of semiconductive material. The elongated member, layer of semiconductive material and layer of electrically insulating material form the cable arrangement.

A detector circuit is electrically connected with the layer of semiconductive material at the semiconductive material reference end portion. The detector circuit includes means for detecting contact between the layer of semiconductive material and an electrically grounded structure due to erosion of the layer of electrically insulating material caused by excessive chafing of the layer of electrically insulating material against the grounded structure. The detector circuit further includes means for providing an indication of the distance measured along the layer of semiconductive material between the semiconductive layers' reference end portion and the location at which the layer of semiconductive material contacts the grounded structure. The detector circuit further includes means for providing an indication that the layer of semiconductive material has at least momentarily contacted the electrically grounded structure in the event the layer of semiconductive material initially contacts the grounded electrical structure and is thereafter removed from contact therefrom.

Still further in accordance with the present invention, there is provided apparatus for detecting excessive chafing between at least one of a plurality of cable arrangements and an electrically grounded structure which includes a plurality of elongated members each having a preselected length, a pair of opposing end portions, and an outer surface extending therebetween. A layer of semiconductive material is positioned in surrounding relation with the outer surface of each elongated member and extends over a preselected length of each member. A layer of electrically insulating material surrounds each layer of semiconductive material. The plurality of elongated members each having a layer of semiconductive material and a layer of electrically insulating material positioned in surrounding relation therewith form a plurality of cable arrangements.

Multiplexing means is provided having a plurality of inputs and an output. The layer of semiconductive material of one of the plurality of cable arrangements is electrically connected with one multiplexing means input. A plurality of detector circuits are connected with the output of the multiplexing means. The multiplexing means is operable to electrically connect, in succession, the semiconductive layer of a preselected one of the plurality of cable arrangements with a preselected one of the plurality of detector circuits. The preselected detector circuit is operable when electrically connected with the preselected cable arrangement semiconductive layer to detect contact between the preselected cable arrangement semiconductive layer and an electrically grounded structure due to the erosion of the electrically insulating layer surrounding the preselected cable arrangement semiconductive layer caused by excessive chafing of the preselected cable arrangement electrically insulating layer against the grounded structure.

Still further in accordance with the present invention, there is provided apparatus for use with an elongated member of preselected length for preventing the member itself from chafing against an electrically grounded structure which includes a layer of semiconductive material arranged to be positioned in surrounding relation with the outer surface of the elongated member and extend over a predetermined length of the member. A layer of electrically insulating material surrounds the layer of semiconductive material. A detector circuit is electrically connected with the layer of semiconductive material. The detector circuit includes means for detecting at least momentary contact between the layer of semiconductive material and an electrically grounded structure due to erosion of the layer of electrically insulating material caused by excessive chafing of the layer of electrically insulating material against the grounded structure. The contact between the layer of semiconductive material and the electrically grounded structure is detected by the detector circuit prior to actual chafing of the elongated member itself against the electrically grounded structure.

BRIEF DESCRIPTION OF THE DRAWINGS

The above as well as other features and advantages of the present invention will become apparent through consideration of the detailed description in connection with the accompanying drawings in which:

FIG. 5A is a perspective view of another alternate embodiment sacrificial covering which forms a portion of the chafing detector apparatus of the present invention;

FIG. 5B is a sectional view taken along line VB-VB of FIG. 5A;

FIG. 6A is a perspective view of still another alternate embodiment sacrificial covering which forms a portion of the chafing detector apparatus of the present invention;

FIG. 6B is a sectional view taken along VIB-VIB of FIG. 6A;

FIG. 7A is a perspective view of still another alternate embodiment sacrificial covering which forms a portion of the chafing detector apparatus of the present invention;

FIG. 7B is a sectional view taken along line VIIB-VIIB of FIG. 7A;

FIG. 8 is a sectional view of a plurality of electrical cables each surrounded with a sacrificial covering, each sacrificial covering connected with a multiplexing-type circuit operable to detect chafing of at least one of the sacrificial coverings against a grounded structural member.

DESCRIPTION OF THE PREFERRED EMBODIMENTS

Figure 1:
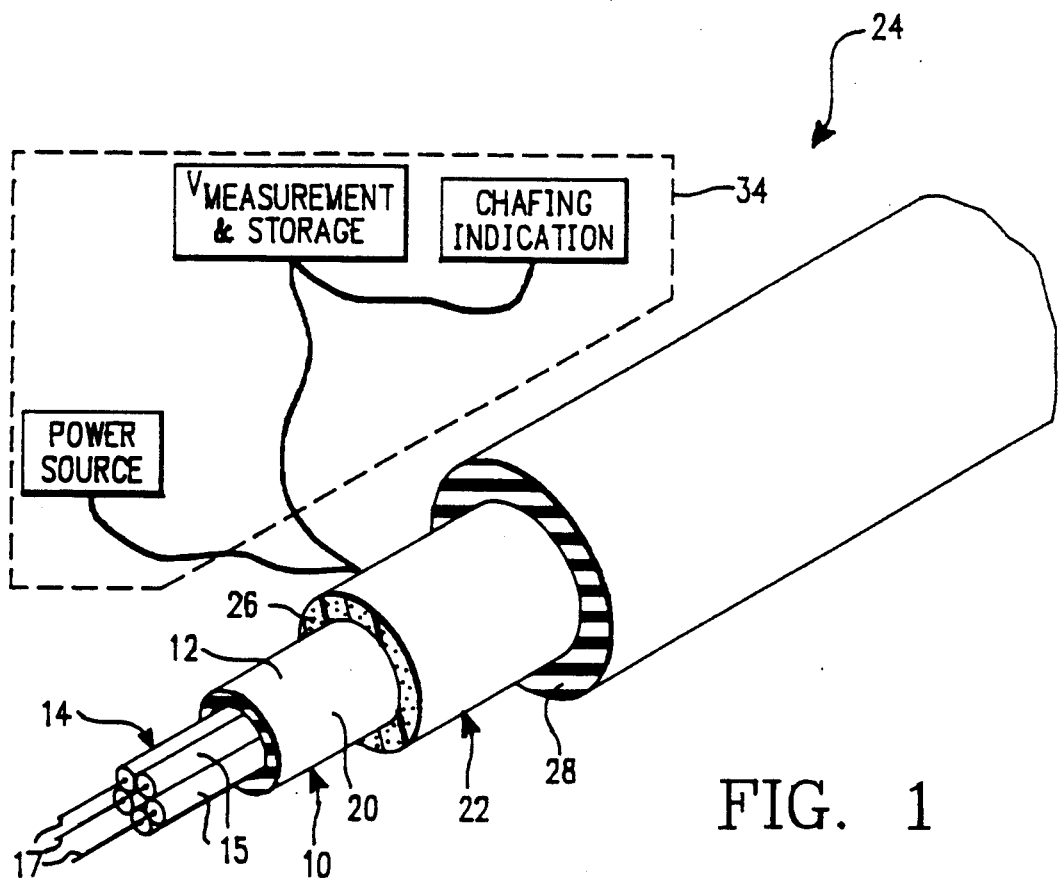
FIG. 1 is a perspective view of a sacrificial covering positioned in surrounding relation with a portion of an electrical cable, and a detector circuit connected with a portion of the sacrificial covering and operable to detect chafing of the sacrificial covering against a grounded structural member.
Figure 2:
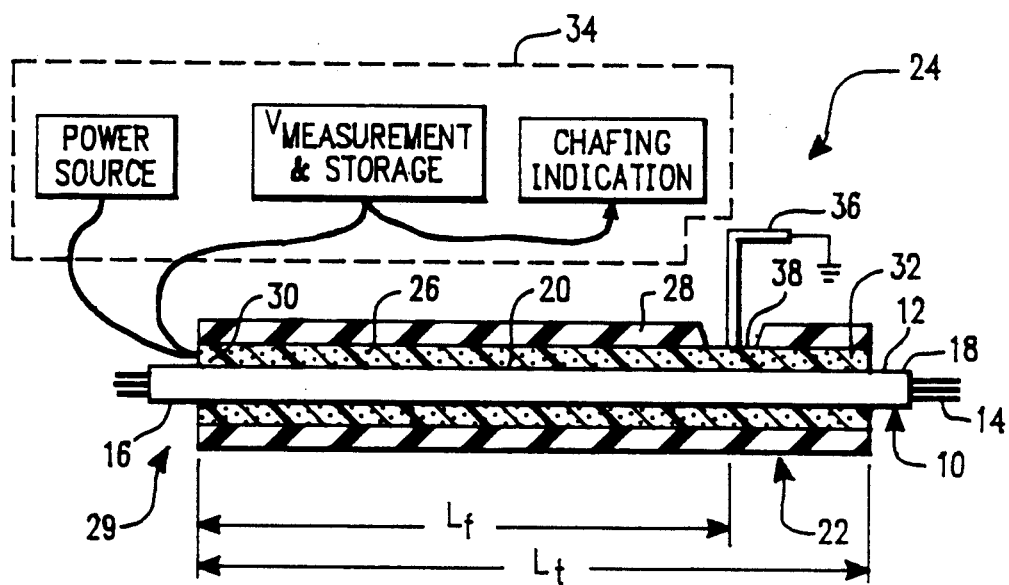
FIG. 2 is a sectional view of a sacrificial covering positioned in surrounding relation with an electrical cable and the detector circuit of FIG. 1 connected with the reference end portion of the sacrificial covering.

Referring to the drawings, and particularly to FIGS. 1 and 2, there is illustrated an electrical cable 10 which includes an outer insulating jacket 12 surrounding a plurality of individual conductors 14. Each conductor 14 includes an outer insulating jacket 15 and a current-carrying conductor 17. Electrical cable 10 has a preselected length, and includes a pair of opposing end portions 16, 18 with the outer insulating surface 20 of the insulating jacket extending therebetween. Cables such as electrical cable 10 are themselves well known in the art, and may be used to connect a plurality of individual electrical components which are physically spaced from each other yet form part of a single electrical system. Due to the spacing between the individual components which may be electrically connected via cable 10, cable 10 normally will be positioned in contacting relation at one or more points along its length with structural support members. In addition, depending upon the environment in which electrical cable 10 is located, cable 10 may be positioned in contacting relation with operating structures controlled by the electrical system. It is apparent that if cable 10 is positioned in contacting relation at various points along its length with structural support members or other operating structures, any relative motion between electrical cable 10 and these structures will result in chafing of the electrical cable outer insulating jacket 12 at one or more of these contact areas. Continued relative motion between the cable and these structures will cause sufficient erosion of the outer insulating jacket 12 of cable 10 and the insulating jacket 15 of at least one of the conductors 14 to eventually cause one or more of the individual current-carrying conductors 17 to contact the structural member. If the structural member is grounded, it is apparent that contact between an individual current-carrying conductor 17 and the grounded structural member will not only result in an interruption of current flow through the cable but may also result in damage to the current-producing power supply (not shown) connected with the cable.

In order to prevent electrical cable 10 from experiencing chafing-induced damage, cable 10 may itself be enclosed in a sacrificial covering 22 which forms a portion of the chafing detector apparatus 24 of the present invention.

As seen in FIGS. 1 and 2, chafing detector apparatus 24 includes sacrificial covering 22 in surrounding relation with the outer surface 20 of electrical cable 10 insulating jacket 12. Specifically, sacrificial covering 22 includes a layer of semiconductive material 26 positioned in surrounding, contacting relation with outer surface 20 and having an overall length $L_t$ to extend over a predetermined length of the cable. A layer of electrically insulating material 28 is positioned in surrounding, contacting relation with semiconductive layer 26. Electrically insulating layer 28 also has an overall length $L_t$ to completely surround semiconductive layer 26 over its entire length. The layer of semiconductive material 26 illustrated in FIGS. 1 and 2 may be formed, for example, from a semiconductive rubber tape, and the layer of electrically insulating material 28 illustrated in FIGS. 1 and 2 may be formed from either a PVC electrical tape or a polymer spiral wrap. Other suitable semiconductive materials which may be utilized to form layer 26 include carbon particle-filled coatings, carbon plus metallic particle-filled coatings, intrinsic semiconductive polymer coatings, for example polypyrole, and conductive particle-filled intrinsic semiconductive polymer coatings. In addition, electrically insulating layer 28 may be formed from an insulating polymer coating. Both layers 26 and 28 may, if desired, be applied by a variety of techniques such as dipping, spraying or brushing, for example.

As will be described herein with respect to FIGS. 4-7B, both the semiconductive and electrically insulating layers 26, 28 may be formed, if desired, from still other suitable materials. The electrical cable 10 and sacrificial covering 22 arrangement illustrated in FIGS. 1 and 2 form a cable arrangement generally designated by the numeral 29. As will be described herein, forming layer 26 from a semiconductive material, i.e., a material which has, for example, a resistance of 100 ohms to 1000 ohms per foot, permits the use of methods to detect chafing of cable arrangement 29 against a grounded structural member that are impractical using existing fault location equipment such as precision wheatstone bridge equipment.

Referring again to FIGS. 1 and 2, semiconductive layer 26 and electrically insulating layer 28 forming sacrificial covering 22 extend over a length $L_t$ of cable 10 intermediate the cables' end portions 16, 18. Semiconductive layer 26 includes a first, reference end portion 30 and an opposite second end portion 32. A detector circuit generally designated by the numeral 34, which also forms a portion of the chafing detector apparatus 24 of the present invention, is connected with semiconductive layer 26 at reference end portion 30. As will be explained herein, detector circuit 34 is operable to detect chafing between cable arrangement 29 and a grounded structural member such as member 36 schematically illustrated in FIGS. 2 which is sufficient to cause the semiconductive layer 26 of the cable arrangement to contact grounded structural member 36 due to erosion of insulating layer 28. The detector circuit 34 of the present invention is also operable to provide an indication of the distance measured along semiconductive layer 26 between the reference end portion 30 and the location or area at which semiconductive layer 26 actually contacts the grounded structural member 36. For example, as seen in FIGS. 2, if grounded structural member 36 contacts semiconductive layer 26 at a location or area 38 due to chafing-induced erosion of the insulating layer at that point, and the distance from reference end portion 30 to contact area 38 is $L_f$, then detector circuit 34 will provide the value $L_f$ or a value proportional thereto so that the exact location of the chafe may be determined and the chafing condition eliminated through repair of the sacrificial layer 22 insulating layer 28. This feature is extremely desirable in that since the overall length of electrical cable 10 and sacrificial covering 22 may be quite long, an excessive amount of time would otherwise be required to inspect the entire length of sacrificial covering 22 to determine the exact location of the chafe-induced contact. By providing a detector circuit such as detector circuit 34 which is capable of determining the exact location of the chafe, the chafed area may be quickly located and repaired. In addition to providing an indication of cable arrangement chafing and the exact location of the chafe, detector circuit 34 is also operable to provide an indication that semiconductive layer 26 has at least momentarily contacted electrically grounded structure 36 in the event that the chafing condition itself is transient, i.e., vibration induced. It is apparent that if cable 10 is used in an environment which causes the cable to be subjected to extreme or prolonged vibration, or in an environment which causes the cable to be subjected to high G forces, chafing of cable arrangement 29 against grounded structural member 36 may only be intermittent. The cable arrangement/detector circuit of the present invention is an improvement over known test equipment capable of detecting a chafing condition only in the event that the individual current-carrying conductors 14 of cable 10 contact grounded structural member 36 through erosion of insulating jacket 12 and contact between the conductors and the grounded member is maintained, i.e., a hard fault. Known test equipment is capable of detecting intermittent contact between the conductors 14 of cable 10 and grounded structural member 36 only in the fortuitous event that the test equipment is used at the precise instant of time that contact between the conductors and grounded member is made. The cable arrangement/detector circuit of the present invention is, on the other hand, capable of detecting chafing between the cable arrangement and a grounded structural member even if only a single, momentary contact between the cable arrangement semiconductive layer and the grounded member takes place.

Figure 3:
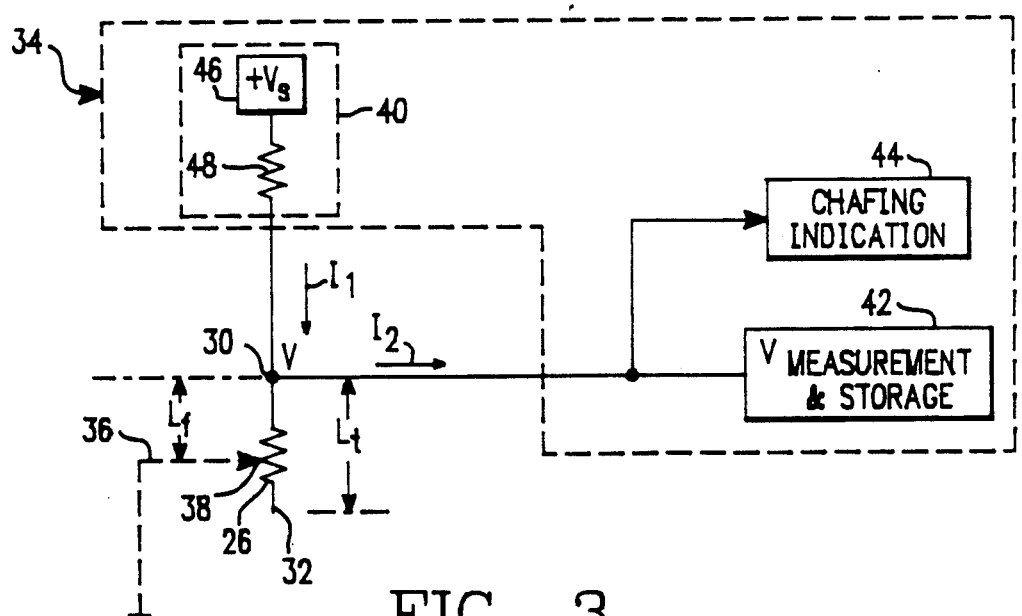
FIG. 3 is a schematic illustration of the cable chafing detector apparatus of the present invention.

Now referring to FIGS. 3, there is schematically illustrated detector circuit 34 connected with the reference end portion 30 of semiconductive layer 26 forming a portion of cable arrangement 29. As seen in FIGS. 3 and as previously described, semiconductive layer 26 has an overall length $L_t$, and includes the first, reference end portion 30 and opposite end portion 32. Since layer 26 is made from a semiconductive material, layer 26 has a resistance per unit length which is greater than the resistance per unit length of a straight conductive material. As previously stated, this permits the use of methods to detect chafing between cable arrangement 29 and grounded member 36 that are impractical using existing fault location equipment.

Detector circuit 34 includes a power source generally designated by the numeral 40, and a V measurement and storage device generally designated by the numeral 42 which provides a chafing indication at 44. As will be described herein in greater detail, chafing indication 44 may be any suitable logic driven device, such as an LED, buzzer or bell. It should be understood that although power source 40 is illustrated in FIGS. 3 as including a regulated voltage source 46 and internal series resistance 48, power source 40 may also be illustrated as known in the art as a constant current source.

As seen in FIGS. 3, with detector circuit 34 connected to the reference end portion 30 of semiconductive layer 26 and semiconductive layer 26 ungrounded, the value of the voltage V present at reference end portion 30 is substantially the same as $V_s$ supplied by voltage source 46. Under this condition, the value of the currents $I_1$ and $I_2$ are substantially zero. However, when semiconductive layer 26 contacts grounded structural member 36 at contact area 38 due to excessive erosion of the electrically insulating layer 28 (shown in FIGS. 1 and 2) against the grounded structural member, the value of the voltage V at the reference end portion 30 of semiconductive layer 26 falls below $V_s$. The distance between the reference end portion 30 of semiconductive layer 26 and the point of contact between semiconductive layer 26 and grounded structural member 36, which is represented as $L_f$ in FIGS. 3, may be calculated as follows:

$$L_f = V \frac{R_s}{R_o (V_s - V)} ; \qquad \text{Equation 1}$$

where $V_s$ equals the voltage supplied by voltage source 46, $R_s$ equals the fixed series resistance 48 of voltage source 46, V equals the voltage at reference end portion 30 and $R_0$ equals the resistance per unit length of semiconductive layer 26.

The distance from the reference end portion 30 of semiconductive layer 26 to the chafing area 38 may be calculated assuming that $I_1$ is much greater than $I_2$. This assumption is valid since V measurement and storage device 42 has a high input impedance. As will be explained further herein, device 42 detects the chafing contact between grounded structural member 36 and semiconductive layer 26 at contact area 38, provides a voltage signal output proportional to the value of $L_f$ and provides an indication of contact via circuit 44 even if the contact is momentary or transient. Various embodiments of detector circuit 34 will be described later herein with reference to FIGS. 9 through 12.

Now referring to FIGS. 4–7B, there are illustrated various alternate embodiments of sacrificial covering 22 which forms a portion of the chafing detector apparatus 24 of the present invention. As previously described with reference to FIGS. 1 and 2, semiconductive and electrically insulating layers 26, 28 may respectively be formed, for example, from semiconducting rubber tape and either a PVC electrical tape or a polymer spiral wrap. However, the sacrificial coverings 22 embodied in FIGS. 4–7B may also be utilized with similar results.

Figure 4:
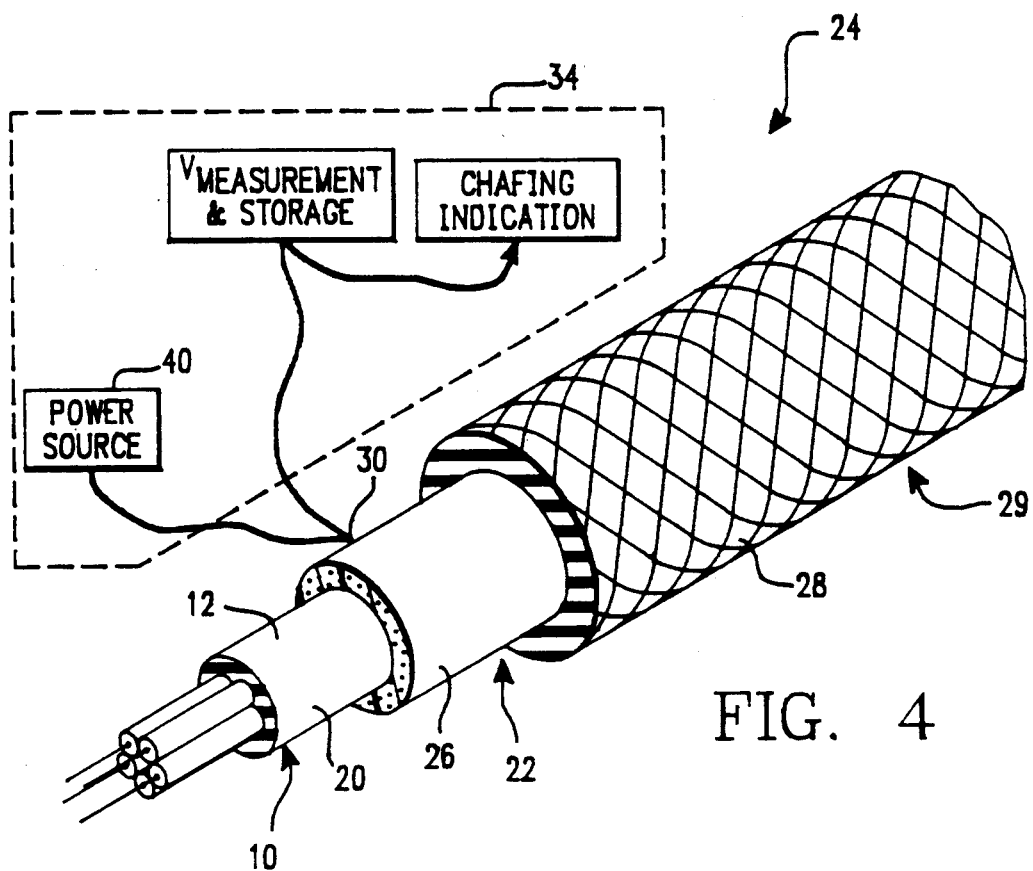
FIG. 4 is a perspective view similar to FIG. 1, illustrating an alternate embodiment sacrificial covering which forms a portion of the chafing detector apparatus of the present invention.

As seen in FIGS. 4, chafing detector apparatus 24 includes the detector circuit 34 previously described and sacrificial covering 22 positioned in surrounding relation with electrical cable 10. Sacrificial covering 22 includes the layer of semiconducting rubber tape 26 positioned in surrounding, contacting relation with the outer surface 20 of electrical cable 10 insulating jacket 12. A layer of electrically insulating material 28 in the form of a polybutylene terephthalate (PBT) expandable braided sleeving is positioned in surrounding relation with semiconductive layer 26. The benefit to using a PBT expandable braided polymer sleeving as the insulating layer of cable arrangement 29 is that the braided polymer sleeving is very easily and rapidly applied, maintains its integrity to temperatures in excess of 125° C. and is extremely flexible.

Now referring to FIGS. 5A and 5B, there is illustrated still another alternate embodiment of the sacrificial covering 22 forming a portion of the chafing detector apparatus 24 of the present invention.

As seen in FIGS. 5A and 5B, an electrically insulating, expandable braided polymer sleeve 54 is positioned in surrounding, contacting relation with the outer surface 20 of electrical cable 10 insulating jacket 12. Expandable braided polymer sleeve 54 has a generally annular cross-sectional configuration to define an inner surface 56 in contact with jacket 12 outer surface 20, an outer surface 58 substantially concentric with inner surface 56 and an annular wall 60 extending between inner and outer surfaces 56, 58. The inner surface 56 and a first predetermined portion 62 of the annular wall 60 adjacent to inner surface 56 are subjected to a preselected dosage of ion irradiation by means well known in the art to impart semiconductive properties to inner surface 56 and the predetermined portion 62 of annular wall 60. The remaining portion 64 of annular wall 60 and outer surface 58 are not subjected to ion irradiation, and thus remain an electrically insulating polymer. As previously stated, the process of ion irradiating or bombarding polymers with energetic ions to convert the polymer to a semiconductive material is itself known in the art. The ion beam energy and beam flux determine the ultimate conductivity of the semiconductive layer. This process can be used with most polymeric materials, and produces a thin semiconductive layer at the surface of the irradiated material. Thus, by subjecting electrically insulating/expandable braided polymer sleeve 54 to an ion irradiation process, the inner surface 56 and a predetermined portion 62 of annular wall 60 may be converted to a semiconductive material. The remaining annular portion 64 of polymer sleeve 54 remains an electrically insulating polymer.

Thus, both the semiconductive and electrically insulating layers 26, 28 previously described herein with reference to FIGS. 1, 2 and 4 may be formed from a single expandable braided polymer sleeve. That is, semiconductive layer 26 corresponds to the predetermined portion 62 of annular wall 60 subject to ion irradiation and electrically insulating layer 28 corresponds to the remaining portion 64 of annular wall 60. The advantage of forming both the semiconductive and electrically insulating layers of sacrificial covering 22 from a single material are that both the semiconductive and electrically insulating layers may be applied to a cable such as electrical cable 10 in a single operation, and the expandable braided sleeving may be easily and rapidly repaired. After the semiconductive layer 52 is formed in the sleeve, detector circuit 34 is connected with the reference end portion 30 of the formed semiconductor layer.

Now referring to FIGS. 6A and 6B, there is illustrated still another alternate embodiment of the sacrificial layer 22 forming a portion of chafing detector apparatus 24 of the present invention. As seen in FIGS. 6A and 6B, sacrificial covering 22 includes a first expandable braided polymer sleeve 66 positioned in surrounding, contacting relation with the outer surface 20 of electrical cable 10 insulating jacket 12. First sleeve 66 has a generally annular cross-sectional configuration to define an inner surface 68 in contacting relation with the outer surface 20 of jacket 12, and outer surface 70 substantially concentric with inner surface 68 and an annular wall 72 extending between inner and outer surfaces 68, 70. The inner surface 68 and a first predetermined portion 74 of annular wall 72 adjacent to inner surface 68 of first polymer sleeve 66 have the properties of an electrical insulating material. The remaining, second portion 76 of annular wall 72 and the outer surface 70 of first polymer sleeve 66 are subjected to a preselected dosage of ion irradiation and thereby converted to a semiconductive material. As described, first expandable braided polymer sleeve 66 has an annular wall extending between its inner and outer surfaces, a portion of the annular wall adjacent to the inner surface and the inner surface itself forming an electrically insulating layer and the remaining portion of the annular wall and the annular wall outer surface forming a layer of semiconductive material. A second expandable braided polymer sleeve 78 is positioned in surrounding, contacting relation with the outer surface 70 of first polymer sleeve 66 and forms an electrically insulating layer. As seen, the portion 76 of annular wall 72 and the outer surface 70 of first polymer sleeve 66 form a semiconductive layer, and second expandable braided polymer sleeve 78 forms an electrically insulating layer. These respective layers correspond to the semiconductive and electrically insulating layers 26, 28 described with respect to FIGS. 1, 2 and 4. After the semiconductive layer 76 is formed in first sleeve 66, detector circuit 34 is connected with the reference end portion 30 thereof.

Now referring to FIGS. 7A and 7B, there is illustrated still another alternate embodiment of the sacrificial covering 22 forming a portion of the chafing detector apparatus 24 of the present invention. As seen in FIGS. 7A and 7B, sacrificial covering 22 is formed from a single section of polymer tubing 80 having an inner surface 82 in surrounding, contacting relation with the outer surface 20 of electrical cable 10 insulating jacket 12. Polymer tubing 80 further includes an outer surface 84 substantially concentric with inner surface 82, and an annular wall 86 extending between inner and outer surfaces 82, 84. A first predetermined portion 88 of annular wall 86 adjacent to inner surface 82 and inner surface 82 are subjected to a preselected dosage of ion irradiation by means well known in the art to form a layer of semiconductive material. The remaining portion 90 of annular wall 86 and outer surface 84, not being subjected to ion irradiation, remain electrically insulating. Thus, the first preselected portion 88 of annular wall 86 corresponds to the layer of semiconductive material 26 previously described with respect to FIGS. 1, 2 and 4 and the second preselected portion 90 of annular wall 88 corresponds to electrically insulating layer 28. After the semiconductive layer 88 is formed in polymer tube 80, detector circuit 34 is connected with the reference end portion 30 of the formed semiconductive layer.

Now referring to FIGS. 8, there are illustrated a plurality of electrical cables 94, 96, 98 each protected by the sacrificial covering 22 previously described. Each sacrificial covering 22 includes a layer of semiconductive material 26 positioned in surrounding, contacting relation with the outer surface of one of the cables 94, 96, 98 (outer surfaces designated as 100, 102, 104, respectively). A layer of electrically insulating material 28 surrounds each semiconductive layer 26. Thus, each of the electrical cables, 94, 96, 98 has a sacrificial covering positioned therearound, each sacrificial covering being formed from a layer of semiconductive material and a layer of electrically insulating material. It should be understood that although three electrical cables 94, 96, 98 are illustrated in FIGS. 8, any desired number of electrical cables may be utilized with the chafing detector apparatus of the present invention.

The layer of semiconductive material 26 of each sacrificial covering 22 includes a reference end portion 30, and each reference end portion 30 is connected with a multiplexing detector circuit generally designated by the numeral 106 which also forms a portion of the chafing detector apparatus of the present invention. As will be described later in greater detail, multiplexing detector circuit 106 and the sacrificial coverings 22 surrounding each of the electrical cables 94, 96, 98 are operable, in combination, to detect when the electrically insulating layer 28 of at least one of the sacrificial coverings 22 surrounding the cables 94, 96, 98 erodes sufficiently due to chafing against a grounded structure to permit contact between the semiconductive layer beneath the eroded electrically insulating layer and the grounded structure. For example, should the cable arrangement 112 formed from electrical cable 94 and its associated sacrificial covering 22 contact first grounded structural member 108, erosion of electrically insulating layer 28 due to excessive chafing between cable arrangement 112 and member 108 at contact area 114 will cause the layer of semiconductive material of cable arrangement 112 to contact first grounded structural member 108. A momentary or single contact between cable arrangement 112 semiconductive layer 26 and first grounded structural member 108 will be detected by multiplexing detector circuit 106, and detector circuit 106 will provide an indication of that contact and the distance between the reference end portion 30 of cable arrangement 112 semiconductive layer 26 and contact area 114. Similarly, a momentary or single contact between the semiConductive layer 26 of cable arrangement 116 and second grounded structural member 110 at contact area 118 will also be detected by multiplexing detector 106, and the detector will provide an indication of the distance between reference end portion 30 of arrangement 116 semiconductive layer 26 and contact area 118.

As described, a desired number of elongated members may each be enclosed in a sacrificial covering formed from layers of semiconductive and electrically insulating material. Each of the elongated members enclosed in a single sacrificial covering is referred to as a cable arrangement. Each cable arrangement is connected with a detector circuit, the detector circuit being operable to provide an indication of excessive chafing of the cable arrangement against an electrically grounded structural member and to provide an indication of the distance measured along the length of the cable arrangement from a reference end portion of the cable arrangement to the chafing area. The detector circuit utilized herein is further operable to provide an indication of a chafing condition even in the event that the chafing condition is transient in nature.

Now referring to FIGS. 9-14, there are illustrated various embodiments of the detector circuit 34 and multiplexing detector circuit 106 previously described with reference to FIGS. 1-8. The various detector circuits schematically illustrated in FIGS. 9-12 correspond to the detector circuits illustrated in FIGS. 1-7A, and are further utilized as building blocks for the multiplexing detector circuits illustrated in FIGS. 13 and 14.

Figure 9:
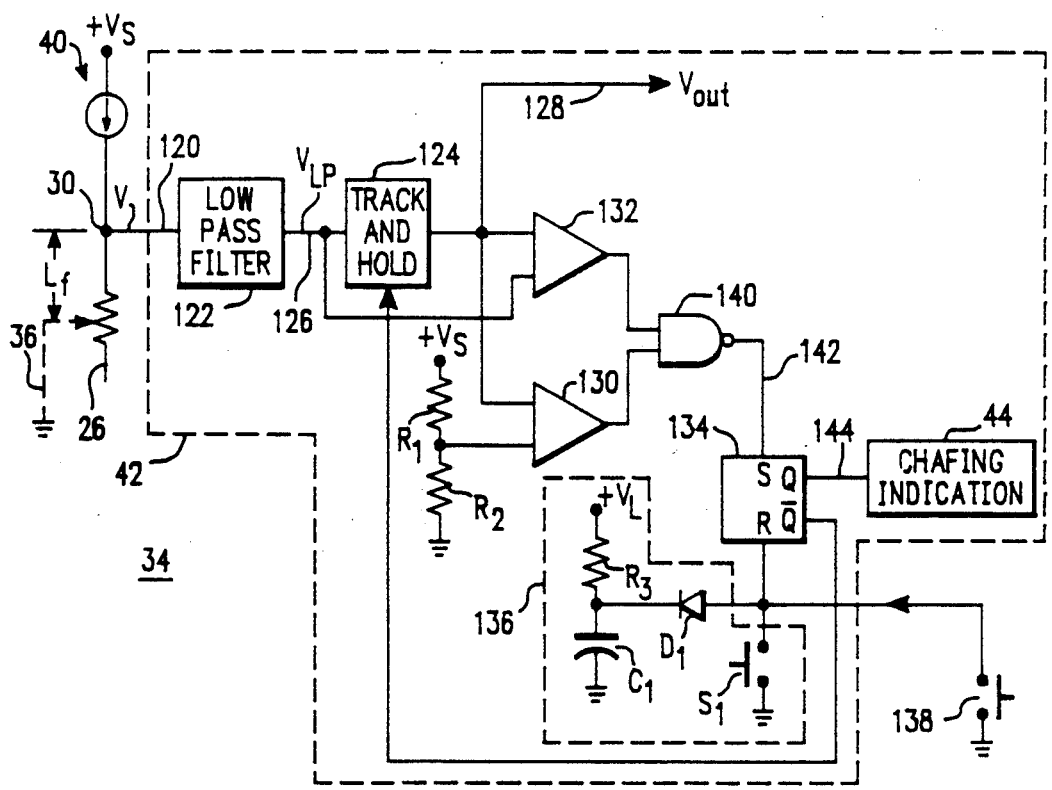
FIG. 9 is a schematic illustration of one embodiment of the detector circuit illustrated in FIGS. 1-4.

Referring first to FIGS. 9, there is illustrated in analog form the detector circuit 34 previously described with reference to FIGS. 1-7A. Analog Detector circuit 34 includes a power source 40 in the form of a constant current source, and a V measurement and storage circuit generally designated by the numeral 42. Both power source 40 and V measurement and storage circuit 42 are connected with the reference end portion 30 of the schematically illustrated semiconductive layer 26 previously described. In the event that the semiconductive layer 26 is insulated from grounded structural member 36, then no current flows through the semiconductive layer. In this situation, the voltage V at the input to V measurement and storage circuit 42 will approximate the power source voltage $V_S$. Momentary shorts of the semiconductive layer 26 to ground through structural member 36 as a result of chafing-induced erosion of the surrounding insulating layer will place negative-going transients at the input 120 of low pass filter 122. Low pass filter 122 is utilized to minimize the effect of noise resulting from erratic contact with structural member 36. If required, low pass filter 122 may also be utilized to scale the value of V. The output of low pass filter 122, designated $V_{LP}$, is supplied to a track and hold circuit 124 on line 126. As known in the art, because of the capacitor charging time within track and hold circuit 124, the output $V_{out}$ on line 128 will lag the input voltage $V_{LP}$ by a small amount. It should be understood that a chafe (semiconductive layer 26 contacting grounded structural member 36 at some point along its length) is defined as: the input voltage V is below a predefined value set by the constant current source multiplied by the maximum cable resistance, and the voltage V at the moment of contact between semiconductive layer 26 and grounded structural member 36 has reached its lowest value and is beginning to rise.

A comparator 130 is utilized to detect the excursion of the voltage V at the moment of contact below the predefined voltage limit. A second comparator 132 is utilized to determine when the voltage $V_{out}$, which lags behind the input voltage $V_{LP}$, is less than the input voltage $V_{LP}$. At this point, the circuit assumes that the input has hit a negative peak and has started to rise. These two conditions cause the flip flow 134 to latch, and cause the track and hold circuit 124 to stop tracking and hold the voltage V at its negative peak. The failure condition latched in flip flop 134 will be used to alert personnel of a chafing condition via chafing indication 44. Indication 44 may be any suitable logic driven device, such as an LED, buzzer or bell. The failure condition remains latched until flip flop 134 is reset either manually utilizing a conventional reset circuit 136 or via an external reset 138. Reset circuit 136 including resistor R3, capacitor C1, diode D1 and switch S1 form the reset network that will cause the fault memory to be cleared upon startup.

Track and hold circuit 124 provides a $V_{out}$ on line 128 that is directly proportional to the distance measured along semiconductive layer 26 from reference end portion 30 to the point at which semiconductive layer 26 contacts electrically grounded structure ($L_f$). By utilizing known scaling techniques, track and hold circuit 124 may be adjusted to provide that the numerical value of $V_{out}$ corresponds to the length $L_f$. In this manner, the exact distance from the reference end portion of the cable arrangement to the chafing point may be determined and displayed with accuracy. In addition, the pair of comparators 130, 132, provide an input at the S-terminal of R-S flip flop 134 via NAND gate 140, and flip flop 134 provides an indication when semiconductive layer 26 has contacted grounded structural member 36. If the output of NAND gate 140 on line 142 is low (logic zero), the input to R-S flip flop 134 on the S terminal is low. This results in the Q-output terminal of the flip flop being high (logic one). In this situation, a logic "one" signal will remain on line 144 indicating contact between semiconductive layer 26 and grounded structure 36, and will remain on line 144 even after contact between the semiconductive layer and the grounded structural member is broken. Thus, V measurement and storage circuit 42 also includes means for maintaining an indication of contact between semiconductive layer 26 and grounded structural member 36 even after the contact is broken due to vibration or some other transient condition. The indication of contact will be maintained on line 144 until R-S flip flop 134 is reset.

As described, V measurement and storage circuit 42 forming a portion of detector circuit 34 may, by utilizing analog techniques, provide an indication that excessive chafing of the cable arrangement has taken place, and further provide an indication of the distance measured from a reference end portion of the cable arrangement to the location of the chafe.

Figure 10:
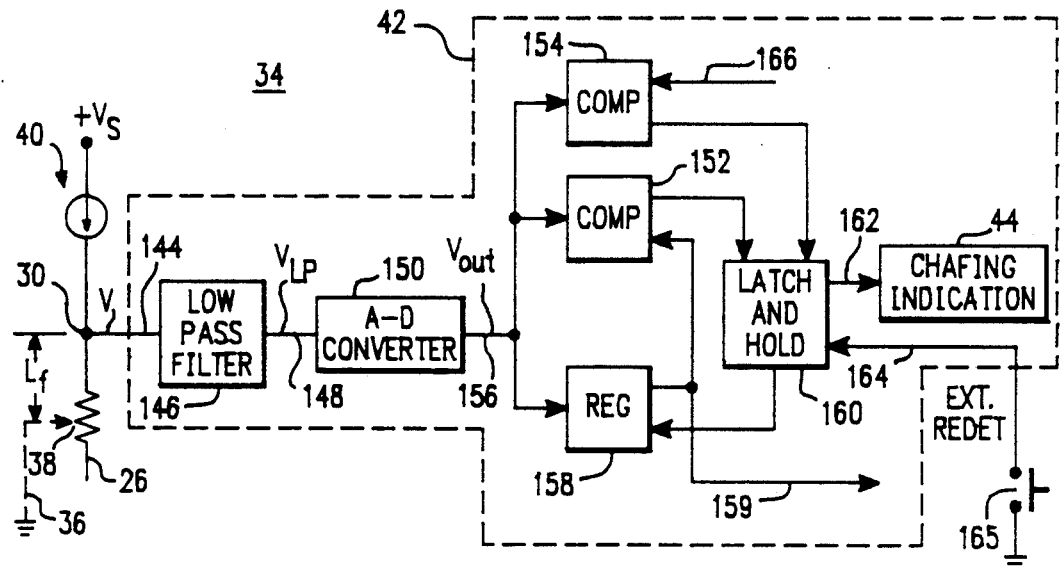
FIGS. 10 is a schematic illustration of an alternate embodiment of the detector circuit illustrated in FIGS. 1-4.

Now referring to FIGS. 10, there is illustrated a digital embodiment of the analog detector circuit 34 previously described with respect to FIGS. 9. As seen in FIGS. 10, detector circuit 34 includes a power source 40 in the form of a constant current source and a V measurement and storage circuit generally designated by the numeral 42. Both the power source 40 and V measurement and storage circuit 42 are connected with the reference end portion 30 of schematically illustrated semiconductive layer 26. As with the analog detector circuit 34 illustrated in FIGS. 9, so long as semiconductive layer 26 is isolated from grounded structural member 36, no current flows in the semiconductive layer 26 and the voltage V at reference end portion 30 will approximate the supply voltage $V_S$. Momentary contact between semiconductive layer 26 and grounded structural member 36 will place negative-going transients at the input 144 to low pass filter 146. Low pass filter 146 is utilized to minimize the effect of noise as previously described with respect to the analog circuit of FIGS. 9. If desired, the low pass filter 146 may also be used to scale the value of V. The output of low pass filter 146, designated as $V_{LP}$, is supplied on line 148 to an A-D converter 150.

As with the V measurement and storage circuit 42 illustrated and described with reference to FIGS. 9, the V measurement and storage circuit 42 of FIGS. 10 recognizes that a chafe condition has occurred when the input voltage V to low pass filter 146 falls below a predefined value set by constant source current 40 multiplied by the maximum resistance of semiconductive layer 26, and the voltage V has reached its lowest value upon contact between semiconductive layer 26 and grounded structural member 36 and has started to rise.

V measurement and storage circuit 42 includes a comparator 154 utilized to detect the excursion of V below the predefined limit. Comparator 152 is utilized to determine when the output voltage $V_{out}$ of converter 150 on line 156 is greater than the previous sample held in register 158. At this point, circuit 42 assumes that V has hit a negative peak and has started to rise. These two conditions cause latch and hold circuit 160 to provide a fault indicating logic signal to chafing indication device 44 on line 162. The current value of the V negative peak is held in register 158 and output on line 159. This value is a digital representation of the distance from the reference end portion 30 of semiconductive layer 26 to the contact area between semiconductive layer 26 and electrically grounded structure 36. Contact between semiconductive layer 26 and grounded structural member 36 indicative of a chafe condition is latched in latch and hold circuit 160. The chafe condition remains latched in latch and hold circuit 160 until circuit 160 is reset on line 164 via an external reset circuit 165. The application of an external signal to latch and hold circuit 160 on input line 164 resets circuit 160 and enables the next chafe condition to be monitored. The comparator 154 includes an input 166 for receiving the predefined or threshold value against which V is compared to determine whether or not an actual contact between semiconductive layer 26 and grounded structural member 36 has occurred; and is also used to detect a voltage rise once comparator 152 has fallen below the predefined limit. It should be understood that although V measurement and storage circuit 42 illustrated in FIGS. 10 is formed from discrete components, all of the functions performed by circuit 42 may be implemented utilizing a microprocessor.

Figure 11:
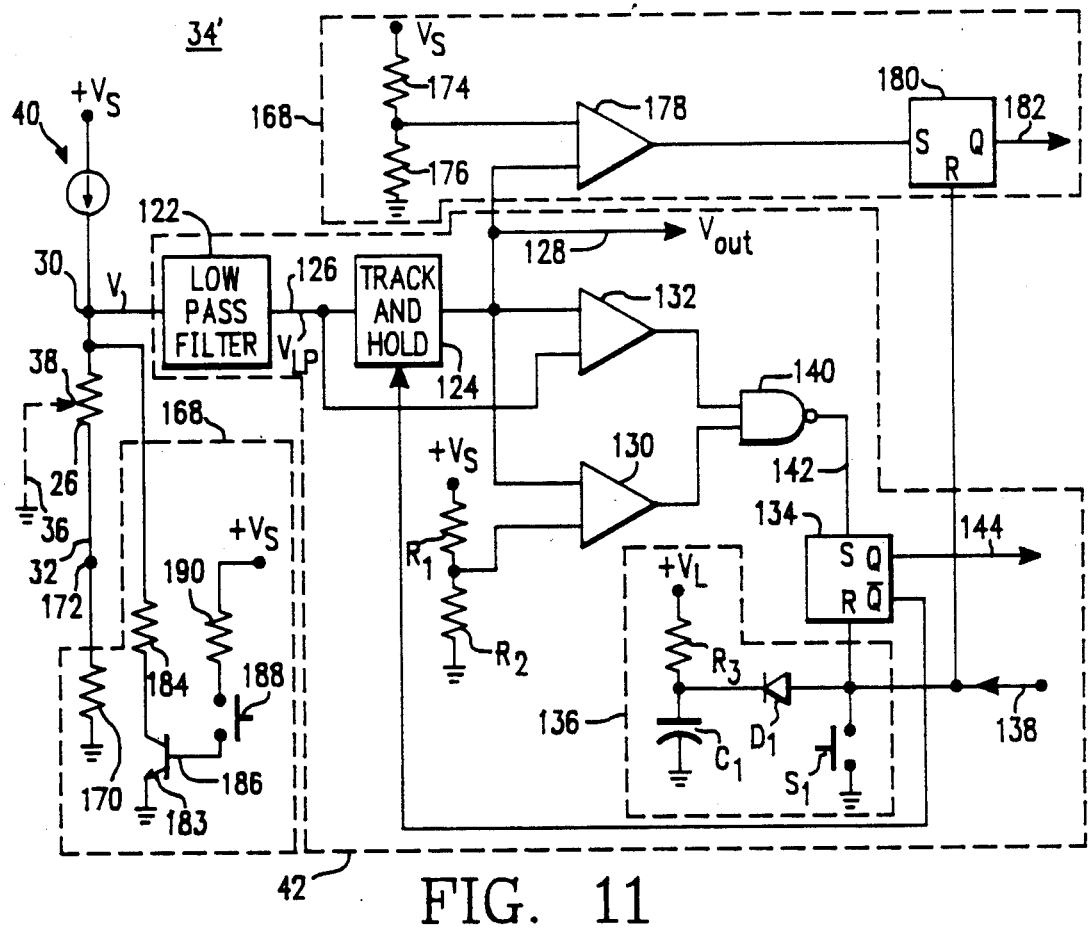
FIGS. 11 is a schematic illustration of still another alternate embodiment of the detector circuit illustrated in FIGS. 1-4.

Now referring to FIGS. 11, there is illustrated another alternate embodiment of the detector circuit 34 of the present invention generally designated by the numeral 34' which includes the power source 40 and V measurement and storage circuit 42 previously described with respect to FIGS. 9. As seen in FIGS. 11, detector circuit 34' includes a built-in-test (BIT) circuit generally designated by the numeral 168. BIT circuit 168 permits an additional level of testing for both the schematically illustrated semiconductive layer 26 and the detector circuit itself. If BIT circuit 168 is utilized, a resistor 170 is connected with the opposite end portion 32 of semiconductive layer 26 at point 172. Resistor 170 itself is grounded. With grounded resistor 170 connected to normally ungrounded semiconductive layer 26, current generated by power source 40 will flow through the semiconductive layer 26 and resistor 170 to ground, producing a voltage drop across the layer of semiconductive material. If semiconductive layer 126 should open for any reason, the voltage V at the input to low pass filter 122 will rise above a preselected threshold voltage value set by resistors 174, 176. This trips comparator 178 and sets the BIT fault flip flop 180 "Q" output 182 at a logic one level, indicating that the integrity of semiconductive layer 26 is suspect.

If contact between semiconductive layer 26 and grounded structural member 36 occurs at 38 indicative of chafing-induced erosion of the cable arrangement electrically insulating layer, the shorting of semiconductive layer 26 to ground through structural member 36 will lower the resistance of the semiconductive layer to a fraction of the overall resistance value. This causes V to drop below the same predefined level as described with respect to FIGS. 9 and the contact between semiconductive layer 26 and grounded structural member 36 will be detected. The effect of the resistor 170 is assumed to be negligible with respect to the effect of the chafe and contact between the semiconductive layer and the grounded structural member.

BIT detector 168 further includes a transistor 183 and resistor 184 which form an optional fault circuit which may be used to test trip the detector circuit. The value of resistor 184 is selected so that the parallel combination of semiconductive layer 26, resistor 170 and resistor 184 will provide a known chafe condition at, for example, 50% of the overall length of the semiconductive layer. The base 186 of transistor 183 is connected to voltage source $V_S$ through a pushbutton 188 and resistor 190. Closing pushbutton 188 initiates a test trip of detector circuit 34' by providing current to the base 186 of transistor 183 of sufficient magnitude to switch transistor 183 on and allow current to flow through the emitter-collector junction of the transistor to ground.

Figure 12:
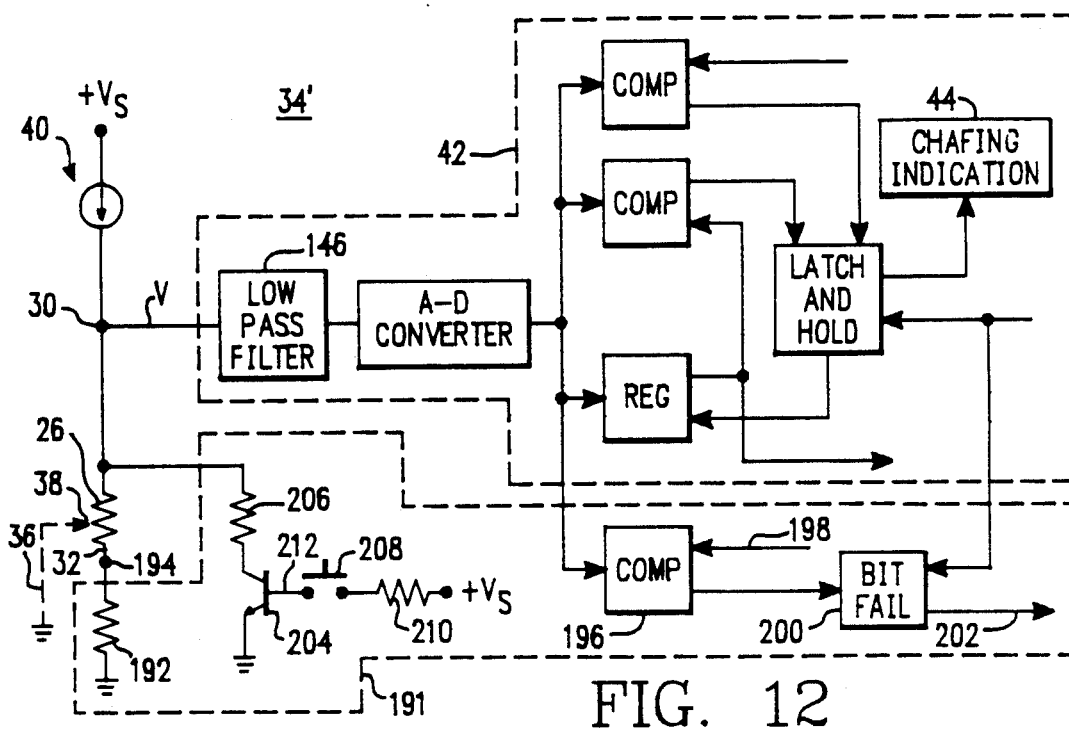
FIGS. 12 is a schematic illustration of yet another alternate embodiment of the detector circuit illustrated in FIGS. 1-4.

Now referring to FIGS. 12, there is illustrated a detector circuit generally designated by the numeral 34' which corresponds to detector circuit 34 previously described with respect to FIGS. 10 and includes built-in-text capability. Detector circuit 34' illustrated in FIG. 12 includes built-in-test (BIT) circuit 191 to allow an additional level of testing of both semiconductive layer 26 and detector circuit 34. If BIT circuit 191 is utilized, then resistor 192 is connected with the end portion 32 of semiconductive layer 26 at connection point 194. Connecting semiconductive layer 26 to ground via resistor 192 will allow current generated by power source 40 to flow through the semiconductive layer and resistor 192, producing a voltage drop across semiconductive layer 26. If the layer of semiconductive material opens for any reason, the voltage V at the input to low pass filter 146 will rise above a threshold voltage value supplied to comparator 196 of bit detector 191 on input line 198. This sets the BIT failure latch 200, and a BIT failure signal is provided from BIT failure latch 200 on output line 202.

If contact is made between semiconductive layer 26 and grounded structural member 36 at 38, semiconductive layer 26 will be shorted to ground via grounded structural member 36 to lower the total resistance of the semiconductive layer to a preselected fraction of the overall semiconductive layer resistance. This causes the voltage V to drop below the same predefined value described with respect to FIGS. 10, and a failure will be detected. The effect of resistor 192 is assumed to be negligible with respect to the effect of grounding of semiconductive layer 26.

Transistor 204 and resistor 206 may be connected in parallel with semiconductive layer 26 and resistor 192 to provide a test mode for BIT detector 191. The value of resistor 206 is selected so the parallel combination of the resistance of semiconductive layer 26, resistor 192 and resistor 206 will simulate a known "chafe" condition at, for example, 50% of the overall length of semiconductive layer 26. A pushbutton 208 and resistor 210 are connected with the base 212 of transistor 204 to provide current to the transistor base and switch transistor 204 "on". With transistor 204 on, a current path is provided through resistor 206 to ground and a test trip of detector circuit 34' is initiated.

As described, any of the detector circuits illustrated in FIGS. 9 through 12 may be utilized in combination with a cable arrangement which includes a sacrificial covering formed from a layer of semiconductive material and a layer of electrically insulating material to detect excessive chafing between the cable arrangement and a grounded structural member. As will now be described herein, multiplexing techniques may be utilized with these same cable arrangements and detector circuits to monitor the chafing of a plurality of cable arrangements such as illustrated and described with reference to FIGS. 8.

Figure 13:
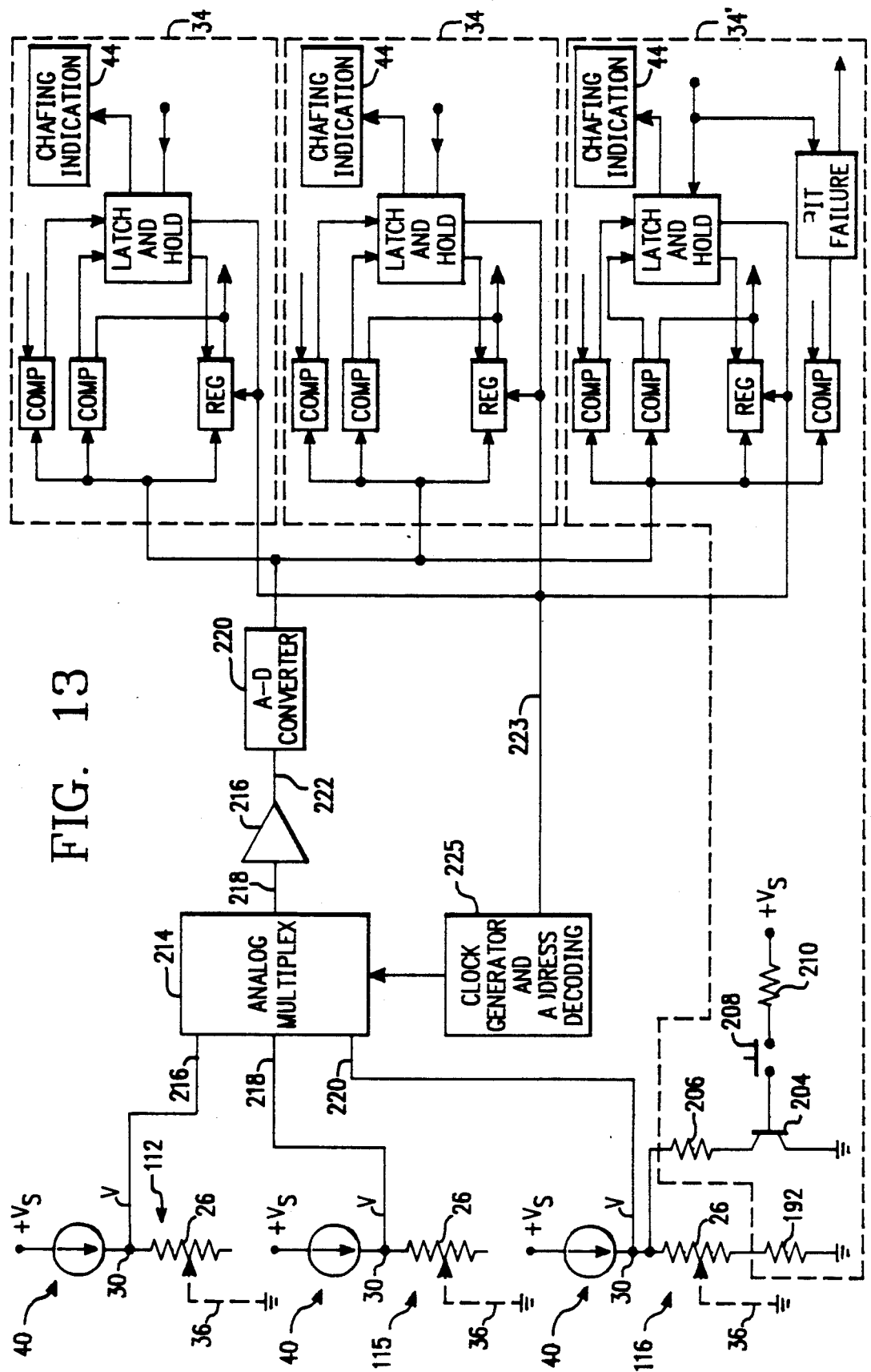
FIGS. 13 is a schematic illustration of the multiplexing detector circuit illustrated in FIGS. 8.

Referring first to FIGS. 13, there are schematically illustrated the semiconductive layers 26 of each of the cable arrangements 112, 115, 116 illustrated and described with reference to FIGS. 8. An analog multiplexing device 214 is provided having a plurality of inputs 216, 218, 220 each connected with the reference end portion 30 of one of the cable arrangements 112, 115, 116 semiconductive layers 26. The reference end portion 30 of each semiconductive layer 26 is also connected with power source 40 as previously described. The use of analog multiplexer 214 allows excessive chafing of any one of the cable arrangements 112, 115, 116 against a grounded structural member such as grounded structural member 36 to be detected. The chafing voltages V are generated upon contact between any of the cable arrangements 112, 115, 116 semiconductive layers and grounded structural member 36. Analog multiplexer 214 successively or sequentially switches between the cable arrangements 112, 115, 116 and presents a multiplexed analog output to low pass filter 216 on line 218. The output of low pass filter 216 is supplied to a common A-D converter 220 on line 222. Low pass filter 216 eliminates any noise at A-D converter 220 input 222. The output of A-D converter 220 is fed, in parallel, to a plurality of digital detector circuits 34 or detector circuits with BIT 34'. As will be described herein, each of the detector circuits is enabled when an appropriate analog input is received from a clock 225. Each of the detector circuits 34, 34' may be either formed from discrete integrated circuits or may be implemented within a microprocessor. Each multiplexed digital value is stored within a single detector circuit and compared with constants to determine the presence or absence of an excessive chafing condition. Individual chafing indications provided by each of the detector circuits 34, 34' may be combined, if desired, to give a composite indication.

As described, analog multiplexer 214 is operable to successively connect the semiconductive layer of one of the cable arrangements 112, 115, 116 with one of the detector circuits 34, 34'. When, for example, the semiconductive layer 26 of cable arrangement 112 is connected via analog multiplexer 214 with one of the detector circuits, the detector circuit is operable to provide an indication if the semiconductive layer of cable arrangement 112 has contacted electrically grounded structure 36 due to erosion of the electrically insulating layer surrounding semiconductive layer 26 caused by excessive chafing of the electrically insulating layer against the grounded structure. It should be understood that each cable arrangement is connected via analog multiplexer 214 to only one of the detector circuits illustrated. In effect, then, a single detector circuit monitors a single cable arrangement during the time they are electrically connected with each other via the multiplexer. The rate at which each of the cable arrangements is connected with one of the detector circuits is determined by a clock 225 connected with analog multiplexer 214. The rate at which the plurality of cable arrangements are successively connected with the plurality of detector circuits may be adjusted by adjusting the clock sampling rate. In addition, clock 225 provides an addressing output 223 to each detector circuit latch and hold circuit to permit sequential enabling of the various detector circuits and the storage of the values of V in sequential fashion in each of the detector circuits.

Figure 14:
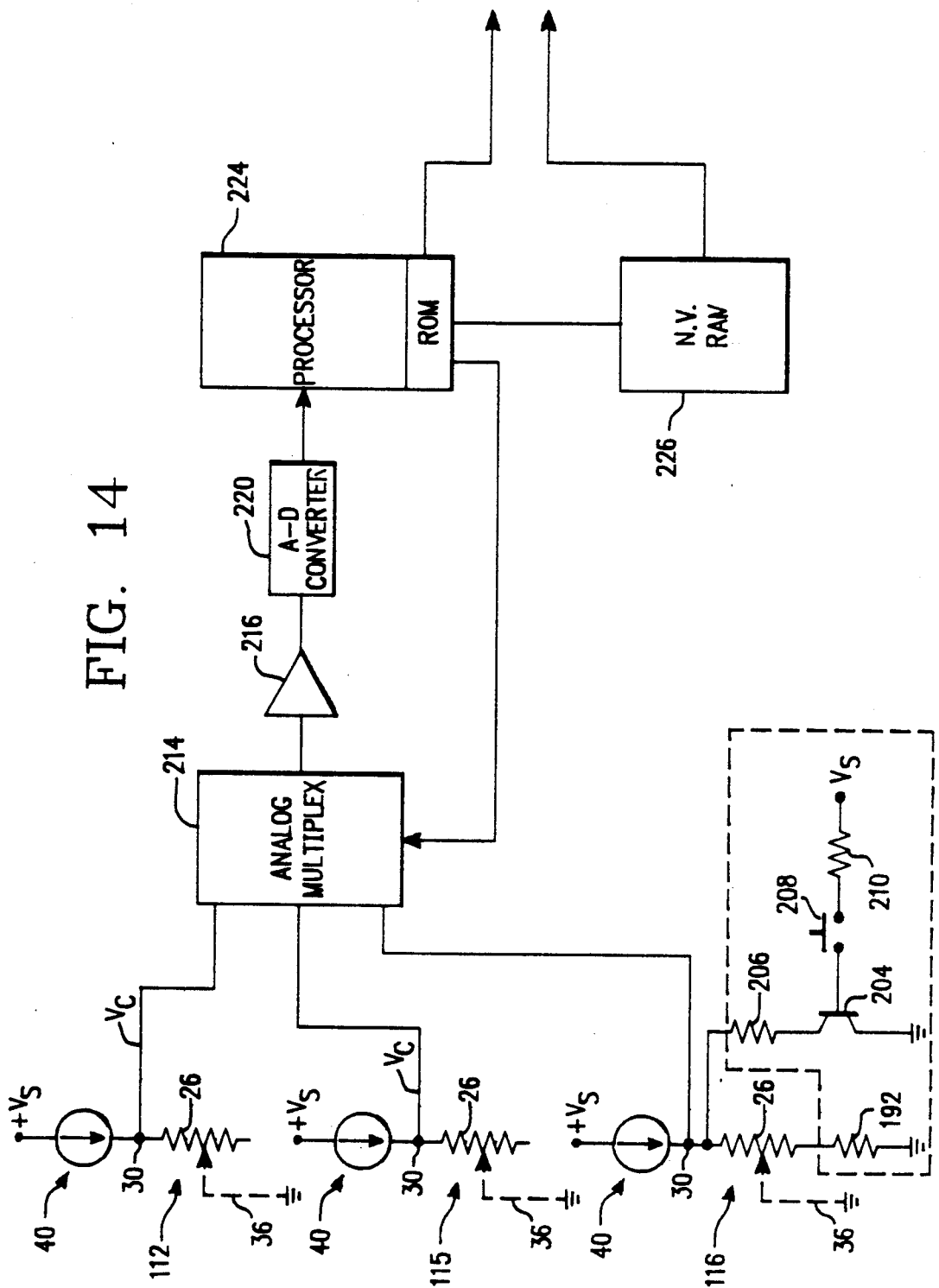
FIGS. 14 is a schematic illustration of an alternate embodiment of the multiplexing detector circuit illustrated in FIGS. 8.

Now referring to FIGS. 14, there is illustrated an alternate embodiment of the multiplexing-type detector circuit illustrated in FIGS. 13, wherein each of the detector circuits 34, 34' illustrated in FIGS. 13 is replaced by a single chip microprocessor 224. If the microprocessor does not have an internal non-volatile random access memory (RAM), a non-volatile RAM 226 may be added externally. The microprocessor 224 is capable of performing all the multiplexing and data conversion if it is a single chip device such as a Motorola 68X05 series microprocessor. If a microprocessor chip such as a Motorola 68X05 series chip is utilized, then the functions performed by analog multiplexer 214, low pass filter 216 and A-D converter 220 may also be performed within the microprocessor.

As described herein, an elongated member such as an electrical cable may be surrounded by a sacrificial covering formed from a layer of semiconductive material and an outer layer of electrically insulating material. The layer of semiconductive material is connected at its reference end portion with a detector circuit. The detector circuit/sacrificial covering combination form a cable chafing detector operable to detect excessive chafing of the sacrificial covering against an electrically grounded structure. The detector circuit is operable to detect at least momentary contact between the layer of semiconductive material and the electrically grounded structure due to erosion of the layer of electrically insulating material caused by excessive chafing of the layer of electrically insulating material against the grounded structure. By utilizing the chafing detector apparatus of the present invention, contact between the layer of semiconductive material forming a portion of the cable arrangement and an electrically grounded structure is detected well prior to actual chafing of the elongated member itself against the electrically grounded structure.

It should be understood that although the sacrificial covering has been described herein as surrounding an electrical cable, sacrificial covering 22 may be placed in surrounding relationship with any type of information-carrying conductor or tubing, such as a ribbon cable or a hydraulic or pneumatic tube. It should be further understood that it is the use of a semiconductive layer as a portion of the sacrificial covering which allows the types of detector circuits such as illustrated in FIGS. 9–14 to be utilized. If semiconductive layer 26 were replaced with a straight conductive layer formed from, for example, a copper sheathing or braid, then the voltage V between the reference end of the straight conductive layer and ground upon contact between the conductive layer and a grounded structural member would be of a high enough value to necessitate the use of precision bridge-type location circuitry. This would not only add to the cost of the location circuit, but would necessarily increase the size of the location circuit making it undesirable for use in situations where size and weight are of critical concern. Further, the momentary nature of transient electrical contact between a straight conductive layer and a grounded structural member resulting from excessive chafing precludes the employment of conventional precision bridge-type fault location techniques which depend on the presence of constant or maintained contact at the time of measurement.

Although the present invention has been described in terms of what are at present believed to be its preferred embodiments, it will be apparent to those skilled in the art that various changes may be made without departing from the scope of the invention. It is therefore intended that the appended claims cover such changes.

We claim:

1. Apparatus for detecting excessive chafing of a cable arrangement against an electrically grounded structure, comprising:
   an elongated member of preselected length having a pair of opposing end portions and an outer surface extending therebetween;
   a layer of semiconductive material positioned in surrounding relation with said outer surface on said elongated member and extending over a predetermined length of said member, said layer of semiconductive material including a first reference end portion and an opposite second end portion;
   a layer of electrically insulating material surrounding said layer of semiconductive material;
   said elongated member, layer of semiconductive material and layer of electrically insulating material forming said cable arrangement;
   detector circuit means electrically connected with said layer of semiconductive material at said reference end portion thereof; and
   said detector circuit means including means for detecting at least momentary contact between said layer of semiconductive material and said electrically grounded structure due to erosion of said layer of electrically insulating material caused by excessive chafing of said layer of electrically insulating material against said grounded structure;
   whereby said contact between said layer of semiconductive material forming a portion of said cable arrangement and said electrically grounded structure is detected by said detector circuit means prior to actual chafing of said elongated member against said electrically grounded structure;
   said detector circuit means further including means for providing, in response to detecting of said at least momentary contact between said layer of semiconductive material and said grounded structure, an output in the form of a voltage signal proportional to the distance measured along said layer of semiconductive material between said reference end portion and the location at which said layer of semiconductive material contacts said grounded structure.

2. The apparatus of claim 1, wherein:
said detector circuit means further includes means for providing an indication that said layer of semiconductive material has at least momentarily contacted said electrically grounded structure after said layer of semiconductive material initially contacts said structure and is thereafter removed from contact therefrom.

3. The apparatus of claim 1, wherein:
said layer of semiconductive material is formed from a semiconductive rubber tape; and
said layer of electrically insulating material is formed from PVC electrical tape.

4. The apparatus of claim 1, wherein:
said layer of semiconductive material is formed from a semiconductive rubber tape; and
said layer of electrically insulating material is formed from a polymer spiral wrap.

5. The apparatus of claim 1, wherein:
said layer of semiconductive material is formed from a semiconductive rubber tape; and
said layer of electrically insulating material is formed from an expandable braided polymer sleeve.

6. The apparatus of claim 1, wherein:

said layer of semiconductive material and said layer of electrically insulating material surrounding said layer of semiconductive material are formed from a single expandable braided sleeve;

said sleeve having a generally annular cross-sectional configuration to define an inner surface, an outer surface substantially concentric with said inner surface and an annular wall extending between said inner and outer surfaces;

said inner surface and a predetermined portion of said annular wall adjacent to said inner surface having semiconductive properties to form said layer of semiconductive material; and the remaining portion of said annular wall and said outer surface having the properties of an electrical insulator to form said layer of electrically insulating material.

7. The apparatus of claim 6, wherein:

said expandable braided sleeve is formed from a polymer material; and said inner surface and said predetermined portion of said annular wall adjacent to said inner surface are subjected to a preselected dosage of ion irradiation to impart semiconductive properties thereto, thereby converting said predetermined portion of said annular wall including said inner surface into said layer of semiconductive material.

8. The apparatus of claim 1, which includes:

a first expandable braided sleeve positioned in surrounding relation with said elongated member, said first braided sleeve having a generally annular cross-sectional configuration to define an inner surface in contacting relation with said outer surface of said elongated member, an outer surface substantially concentric with said inner surface and an annular wall extending between said inner and outer surfaces;

said inner surface and a first, predetermined portion of said annular wall adjacent to said inner surface having the properties of an electrical insulator;

the remaining, second portion of said annular wall and said outer surface having semiconductive properties to form said layer of semiconductive material; and a second expandable braided sleeve positioned in surrounding relation with said first braided sleeve and having the properties of an electrical insulator to form said layer of electrically insulating material.

9. The apparatus of claim 8, wherein:

said first and second expandable braided sleeves are each formed from a polymer material; and said first sleeve second portion of said annular wall and said outer surface are subjected to a preselected dosage of ion irradiation to impart semiconductive properties thereto, thereby converting said second portion of said annular wall including said outer surface into said layer of semiconductive material.

10. The apparatus of claim 1, wherein:

said layer of semiconductive material and said layer of electrically insulating material are formed from a single section of tubing;

said tubing having a generally annular cross-sectional configuration to define an inner surface, an outer surface substantially concentric with said inner surface and an annular wall extending between said inner an outer surfaces;

said inner surface and a predetermined portion of said annular wall adjacent to said inner surface having semiconductive properties to form said layer of semiconductive material; and the remaining portion of said annular wall and said outer surface having electrically insulating properties to form said layer of electrically insulating material.

11. The apparatus of claim 10, wherein:

said tubing is formed from a polymer material and said inner surface and said predetermined portion of said annular wall adjacent to said inner surface are subjected to a preselected dosage of ion irradiation to impart semiconductive properties thereto, thereby converting said predetermined portion of said annular wall including said inner surface into said layer of semiconductive material.

12. The apparatus of claim 1, wherein:

said outer surface of said elongated member has a semiconductive coating thereon, said coating forming said layer of semiconductive material; and said layer of electrically insulating material is formed from a section of polymer tubing positioned in surrounding, contacting relation with said semiconductive coating.

13. Apparatus for detecting excessive chafing of a cable arrangement against an electrically grounded structure, comprising:

an elongated member of preselected length having a pair of opposing end portions and an outer surface extending therebetween;

a layer of semiconductive material positioned in surrounding relation with said outer surface of said elongated member and extending over a predetermined length of said member, said layer of semiconductive material including a first, reference end portion and an opposite second end portion;

a layer of electrically insulating material surrounding said layer of semiconductive material;

said elongated member, layer of semiconductive material and layer of electrically insulating material forming said cable arrangement;

detector circuit means electrically connected with said layer of semiconductive material at said reference end portion;

said detector circuit means including means for detecting at least momentary contact between said layer of semiconductive material and said electrically grounded structure due to erosion of said layer of electrically insulating material caused by excessive chafing of said layer of electrically insulating material against said grounded structure;

said detector circuit means further including means for providing, in response to detecting said at least momentary contact between said layer of semiconductive material and said grounded structure, an output in the form of a voltage signal proportional to the distance measured along said layer of semiconductive material between said reference end portion and the location at which said layer of semiconductive material contacts said grounded structure; and said detector circuit means further including means for providing, in response to detecting said at least momentary contact between said layer of semiconductive material and said grounded structure, an indication that said layer of semiconductive material has at least momentarily contacted said electrically grounded structure after said layer of semiconductive material initially contacts said grounded electrical structure and is thereafter removed from contact therefrom.

14. The apparatus of claim 13, wherein:

said detector circuit means is operable to provide a reference signal to said reference end portion of said layer of semiconductive material, said reference signal having a first preselected value when said layer of semiconductive material is insulated from said grounded structure by said layer of insulating material, said first preselected value being changed to a second value at said reference end portion when said layer of semiconductive material contacts said grounded structure due to excessive erosion of said layer of insulating material;

said detector circuit means being responsive to said reference signal at said second value to provide said indication that said layer of semiconductive material has come in contact with said grounded structure; and said detector circuit means further including means for storing said reference signal at said second value to said indication that said layer of semiconductive material has at least momentarily contacted said electrically grounded structure after said layer of semiconductive material is removed from contact with said structure.

15. The apparatus of claim 14, wherein:

said layer of semiconductive material has a substantially uniform resistance per unit length to provide that said second value of said reference signal is proportional to the distance measured along said layer of semiconductive material between said reference end portion and the location at which said layer of semiconductive material contacts said grounded structure; and said detector circuit means is operable to provide said reference signal at said second value as said indication of said distance between said reference end portion and said location at which said layer of semiconductive material contacts said grounded structure.

16. A plurality of cable arrangements each connected with apparatus for detecting excessive chafing of at least one of said arrangements against an electrically grounded structure, comprising:

a plurality of elongated members each having a preselected length, a pair of opposing end portions and an outer surface extending therebetween;

a layer of semiconductive material positioned in surrounding relation with the outer surface of each said elongated member and extending over a preselected length of said member, each said layer of semiconductive material including a first reference end portion and an opposite second end portion;

a layer of electrically insulating material surrounding each layer of semiconductive material;

said plurality of elongated members each having a layer of semiconductive material and a layer of electrically insulating material positioned in surrounding relation therewith forming a plurality of cable arrangements;

multiplexing means having a plurality of inputs and an output, the layer of semiconductive material of one of said plurality of cable arrangements being electrically connected at said reference end portion thereof with one of said inputs;

a plurality of detector circuit means each electrically connected with said outputs of said multiplexing means;

said multiplexing means being operable to electrically connect, in succession, the semiconductive layer of one of said plurality of cable arrangements with one of said plurality of detector circuit means; and said one detector circuit means being operable when electrically connected with said one cable arrangement semiconductive layer for detecting at least momentary contact between said one cable arrangement semiconductive layer and an electrically grounded structure and providing, in response thereto, an indication when said one cable arrangement semiconductive layer has come in said at least momentary contact with said electrically grounded structure due to erosion of the electrically insulating layer surrounding said one cable arrangement semiconductive layer caused by excessive chafing of said one cable arrangement electrically insulating layer against said grounded structure;

whereby the contact of any of the semiconductive layers associated with said plurality of cable arrangements is detected prior to chafing of any of the elongated members associated with said plurality of cable arrangements against said grounded structure;

said one detector circuit means further being operable when electrically connected with said one cable arrangement semiconductive layer for providing, in response to detecting of said at least momentary contact between said one cable arrangement semiconductive layer and said grounded structure, an output in the form of a voltage signal proportional to the distance measured along said layer of semiconductive material between said reference end portion and the location at which said layer of semiconductive material contacts said grounded structure.

17. The plurality of cable arrangements each connected with apparatus for detecting excessive chafing of at least one of said arrangements against an electrically grounded structure as set forth in claim 16, wherein:

each said detector circuit means includes a power source, the power source of one said detector circuit means being connected with the layer of semiconductive material of one said cable arrangement at said reference end portion;

said power source being operable to provide a reference signal to said one cable arrangement layer of semiconductive material at said reference end portion, said reference signal having a first preselected value when said one cable arrangement layer of semiconductive material arrangement is insulated from said grounded structure by said one cable arrangement layer of electrically insulating material, said first preselected value being changed to a second value of said one cable arrangement layer of semiconductive material reference end portion when said one cable arrangement layer of semiconductive material of said one cable arrangement contacts said grounded structure due to excessive erosion of said one cable arrangement layer of insulating material;

said one detector circuit means being responsive to said reference signal at said second value to provide an indication that said one cable arrangement layer of semiconductive material has come in contact with said grounded structure; and said one detector circuit means further including means for storing said reference signal at said second value to maintain said indication that said one cable arrangement layer of semiconductive material has at least momentarily contacted said electrically grounded structure after said one cable arrangement layer of semiconductive material is removed from contact with said structure.

18. The plurality of cable arrangements each connected with apparatus for detecting excessive chafing of at least one of said arrangements against an electrically grounded structure as set forth in claim 17, wherein:

said one cable arrangement layer of semiconductive material has a substantially uniform resistance per unit length to provide that said second value of said reference signal is proportional to the distance measured along said one cable arrangement layer of semiconductive material between said one cable arrangement layer of semiconductive material reference end portion and the location at which said one cable arrangement layer of semiconductive material contacts said grounded structure; and said one detector circuit means is operable to display said reference signal at said second value as an indication of said distance between said one cable arrangement layer of semiconductive material reference end portion and said location at which said one cable arrangement layer of semiconductive material contacts said grounded structure.

19. The plurality of cable arrangements each connected with apparatus for detecting excessive chafing of at least one of said arrangements against an electrically grounded structure as set forth in claim 16, wherein:

the layer of semiconductive material surrounding each said cable arrangement elongated member is formed from a semiconductive polymer material; and the layer electrically insulating material surrounding each said cable arrangement layer of semiconductive material if formed from an electrically insulating polymer material.

20. Apparatus for use with an elongated member of preselected length and having a pair of opposing end portions and an outer surface extending therebetween for protecting said member from said chafing against an electrically grounded structure, comprising:

a layer of semiconductive material arranged to be positioned in surrounding relation with said outer surface of said elongated member and extending over a predetermined length of said member, said layer of semiconductive material including a first reference end portion and an opposite second end portion;

a layer of electrically insulating material surrounding said layer of semiconductive material;

detector circuit means electrically connected with said layer of semiconductive material at said reference end portion thereof; and said detector circuit means including means for detecting at least momentary contact between said layer of semiconductive material and said electrically grounded structure due to erosion of said layer of electrically insulating material caused by excessive chafing of said layer of electrically insulating material against said grounded structure;

whereby said contact between said layer of semiconductive material with said electrically grounded structure is detected by said detector circuit means prior to actual chafing of said elongated member against said electrically grounded structure;

said detector circuit means further including means for providing, in response to detecting said at least momentary contact between said layer of semiconductive material and said grounded structure, an output in the form of a voltage signal proportional to the distance measured along said layer of semiconductive material between said reference end portion and the location at which said layer of semiconductive material contacts said grounded structure.

21. The apparatus of claim 20, wherein:

said detector circuit means further includes means for providing an indication that said layer of semiconductive material has at least momentarily contacted said electrically grounded structure after said layer of semiconductive material initially contacts said structure and is thereafter removed from contact therefrom.

* * * * *